(12) United States Patent
Baumgartner et al.

(10) Patent No.: US 12,155,397 B2
(45) Date of Patent: Nov. 26, 2024

(54) CONTROL LOOP CIRCUITRY

(71) Applicant: Micron Technology, Inc., Boise, ID (US)

(72) Inventors: Steven J. Baumgartner, Zumbro Falls, MN (US); Neeraj Savla, Inver Grove Heights, MN (US)

(73) Assignee: Micron Technology, Inc., Boise, ID (US)

( * ) Notice: Subject to any disclaimer, the term of this patent is extended or adjusted under 35 U.S.C. 154(b) by 165 days.

(21) Appl. No.: 17/892,760

(22) Filed: Aug. 22, 2022

(65) Prior Publication Data
US 2023/0396266 A1 Dec. 7, 2023

Related U.S. Application Data

(60) Provisional application No. 63/348,436, filed on Jun. 2, 2022.

(51) Int. Cl.
*H03M 1/78* (2006.01)
*H03F 3/45* (2006.01)

(52) U.S. Cl.
CPC ........ *H03M 1/785* (2013.01); *H03F 3/45179* (2013.01)

(58) Field of Classification Search
CPC ........ H03M 1/765; H03M 1/682; H03M 1/68; H03M 1/687; H03M 1/785; H03M 1/002; H03M 1/06; H03M 1/0602; H03M 1/0682; H03M 1/662; H03M 1/742; H03M 1/745; H03M 1/747; H03M 1/0612; H03M 1/0614; H03M 1/0663; H03M 1/0845; H03M 1/1061; H03M 1/1205; H03M 1/76; H03M 1/78; H03M 1/808
USPC ........................................ 341/144, 145, 154
See application file for complete search history.

(56) References Cited

U.S. PATENT DOCUMENTS

| | | | | |
|---|---|---|---|---|
| 4,491,825 A * | 1/1985 | Tuthill | ................ | H03M 1/0663 341/145 |
| 5,703,588 A * | 12/1997 | Rivoir | ................ | H03M 1/0604 341/145 |
| 5,969,657 A * | 10/1999 | Dempsey | .............. | H03M 1/682 341/145 |
| 6,954,165 B2 * | 10/2005 | Mallinson | ........... | H03M 1/0604 341/154 |
| 7,030,790 B1 * | 4/2006 | Chen | ................... | H03M 1/0845 341/118 |
| 7,388,531 B1 * | 6/2008 | Cyrusian | ............. | H03M 1/0604 341/144 |
| 7,425,941 B2 * | 9/2008 | Sung | .................... | G09G 3/3688 345/98 |
| 7,639,166 B2 * | 12/2009 | Iijima | ................... | H03M 1/682 341/145 |

(Continued)

*Primary Examiner* — Linh V Nguyen
(74) *Attorney, Agent, or Firm* — Brooks, Cameron & Huebsch, PLLC

(57) ABSTRACT

Various embodiments of the present disclosure relate to apparatuses and methods for control loop circuitry. An interface circuit can comprise a digital to analog converter (DAC) configured to provide a differential output signal, a first control loop portion configured to receive a gain reference voltage and to output a first bias voltage to the DAC; and a second control loop portion configured to receive a common mode voltage of a differential input signal and to output a second bias voltage to the DAC.

19 Claims, 4 Drawing Sheets

(56) References Cited

U.S. PATENT DOCUMENTS

| | | | | |
|---|---|---|---|---|
| 7,956,786 B2* | 6/2011 | Cosgrave | ............. | H03M 1/682 |
| | | | | 341/145 |
| 8,907,832 B2* | 12/2014 | Price | ....................... | H03M 1/68 |
| | | | | 341/145 |
| 9,083,380 B2* | 7/2015 | Price | ....................... | H03M 1/78 |
| 9,917,595 B2* | 3/2018 | Frank | .................... | H03M 1/785 |
| 2007/0171112 A1* | 7/2007 | Park | .................... | H03M 1/0845 |
| | | | | 341/144 |

* cited by examiner

CONTROL LOOP CIRCUITRY

PRIORITY INFORMATION

This application claims the benefit of U.S. Provisional Application No. 63/348,436, filed Jun. 2, 2022, the contents of which are incorporated herein by reference.

TECHNICAL FIELD

Embodiments of the disclosure relate generally to memory systems, and more specifically, relate to apparatuses and methods for control loop circuitry

BACKGROUND

A memory system can include a memory sub-system, which can be a storage device, a memory module, or a hybrid of a storage device and a memory module. Examples of a storage device include a solid-state drive (SSD), a Universal Flash Storage (UFS) drive, a secure digital (SD) card, an embedded Multiple Media Card (eMMC), and a hard disk drive (HDD). Examples of memory modules include a dual in-line memory module (DIMM) and various types of non-volatile dual in-line memory modules (NVDIMMs). Memory systems include one or more memory components (e.g., memory devices) that store data. The memory components can be, for example, non-volatile memory components (e.g., NAND flash memory devices) and volatile memory components (e.g., DRAM devices). In general, a host system can utilize a memory system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
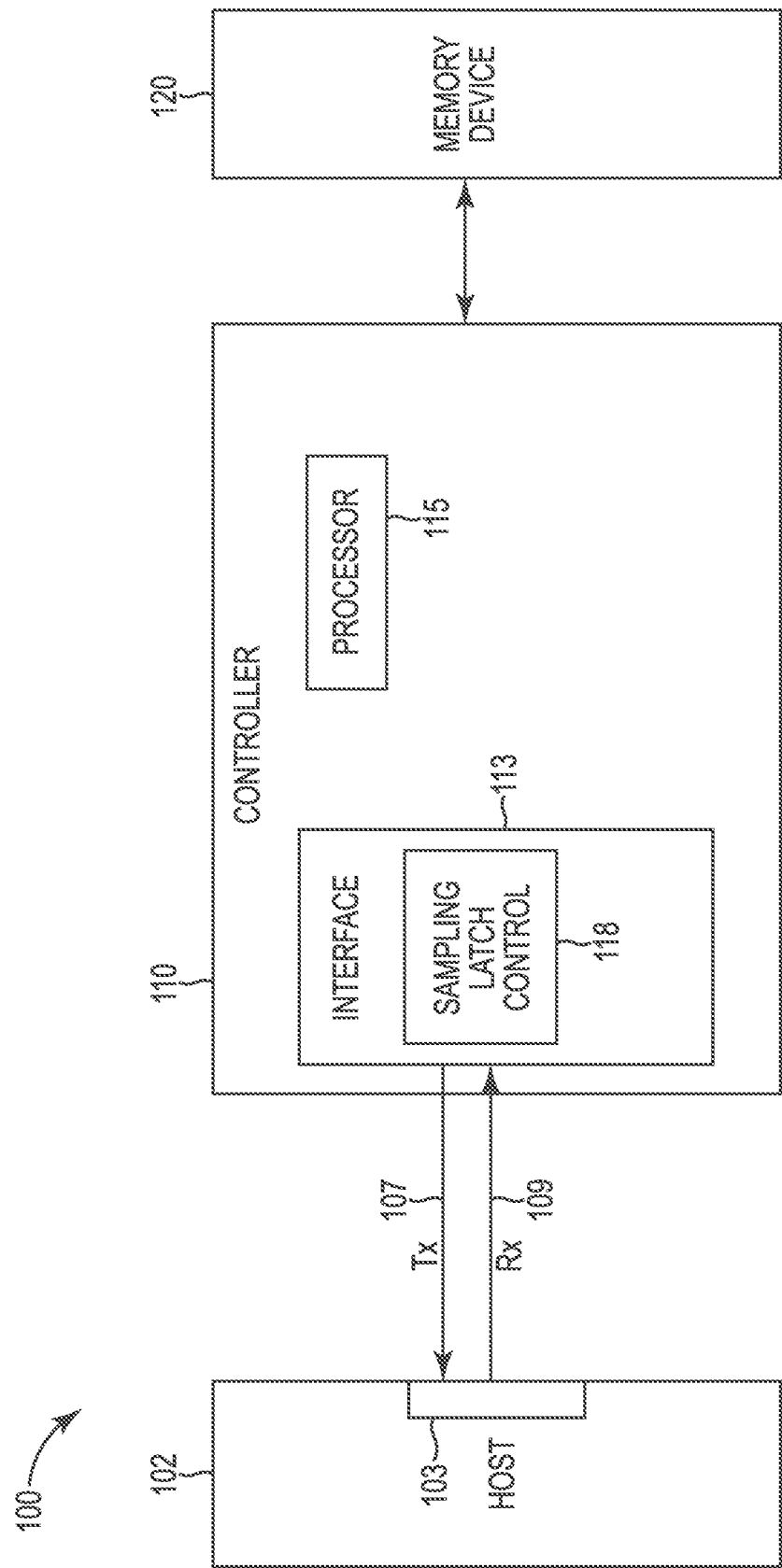
FIG. 1 illustrates an example computing environment that includes a memory system having interface circuitry in accordance with various embodiments of the present disclosure.

Aspects of the present disclosure are directed to apparatuses and methods for control loop circuitry for providing improved analog to digital conversion of signals transmitted across physical interfaces. Various electronic components (e.g., memory chips, controller chips, processor chips, etc.) communicate with each other via signals (e.g., data signals) transmitted across channels between a physical layer interface (PHY), which can include a serializer/deserializer (SerDes), for example. Such interfaces can often include sampling latches, which may also be referred to as "slicers" or clocked comparators, to convert analog signals (e.g., differential signals) to digital signals. The digital outputs of the sampling latches can be used to provide various functions including clock data recovery (CDR) edge sampling, vertical eye monitoring, and decision feedback equalization (DFE), for example. An array of digital to analog converters (DACs) can be used to provide differential voltages to respective sampling latches to compensate for mismatch between differential devices (e.g., transistors) of the sampling latches or to otherwise adjust their sampling thresholds ("slicing" level thresholds) to a desired level. Accurate and fine granularity of the sampling thresholds of the sampling latches is beneficial in recovering error free digital information from the analog data signals. Typical analog signals in modern high speed serial links are significantly small after suffering various losses from the physical channels and incurring noise picked up from crosstalk and device noise.

One approach to setting the sampling thresholds of the sampling latches includes using a ladder DAC between power rails. Such an approach can have a poor power supply rejection ratio (PSRR) since noise on the supply signal is converted to differential noise at the DAC outputs based on voltage division across the resistors in the ladder. Such prior ladder DAC approaches also provide limited control of the output common mode voltage without additional header and/or footer devices and a control scheme. Another approach to setting the sampling thresholds of the sampling latches can include using current steering DACs. However, such current steering DACs an have range and linearity issues for low voltage applications since constant current transistor elements suffer loss of headroom as the drain-source current (Ids) decreases at low drain-source voltage (Vds).

Various embodiments of the present disclosure address the above and other deficiencies by providing control loop circuitry capable of controlling differential DAC gain and common mode voltage associated with providing differential signals to sampling latches of a PHY, such as an M-PHY (e.g., MIPI M-PHY). In various embodiments, the control loop circuitry provides the ability to track the common mode voltage of the differential signal being sampled (e.g., a common mode voltage of an equalizer output provided to the sampling latch), as well as the ability to set the common mode voltage of sampling threshold to be equal to the common voltage of the differential signal being sampled. Embodiments provide various benefits including the ability to be implemented in low power applications and scalability as well as improved PSRR as compared to prior approaches. Embodiments can also provide accurate differential DAC gain and the ability to set common mode voltage independently of the DAC gain.

FIG. 1 illustrates an example computing environment that includes a memory system having interface circuitry 113 in accordance with various embodiments of the present disclosure. In this example, the memory system comprises a controller 110 (e.g., a system controller) coupled to one or more memory devices 120.

In some embodiments, the memory system is a storage system. An example of a storage system is a solid-state drive (SSD). In some embodiments, the memory system is a hybrid memory/storage sub-system. In general, the computing environment 100 shown in FIG. 1 can include a host 102 (e.g., a host system) that uses the memory system. For example, the host 102 can write data to the memory devices 120 and read data from the memory devices 120 via controller 110.

The host 102 can be a computing device such as a desktop computer, laptop computer, network server, mobile device, or other such computing device that includes a memory and a processing device. The host 102 is coupled to the memory system via a physical interface (PHY). In this example, the physical interface between the host 102 and memory system includes interface circuitry 103 of the host 102 and interface circuitry 113 of the controller 110 and may be referred to as a physical host interface to distinguish it from a physical interface between the controller 110 and the memory devices 120, which may be referred to as a memory interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interfaces include, but are not limited to, a serial advanced technology attachment (SATA) interface, a peripheral component interconnect express (PCIe) interface, a universal flash storage (UFS) interface, a universal serial bus (USB) interface, Fibre Channel, Serial Attached SCSI (SAS), a mobile industry processor interface (MIPI), etc. The physical host interface can be used to transmit data between the host 102 and the memory system 110. The host 102 can further utilize a memory interface such as a Non-Volatile Memory Express (NVMe) interface or an Open NAND Flash Interface (ONFI), for example, to access the memory devices.

In general, the physical host interface can provide an interface for passing signals (e.g., control, address, data, etc.) between the memory system and the host 102. As described further below, the host interface is used for communication between the host 102 and controller 110 over a number of channels that can include transmission link (Tx) 107 and receiver link (Rx) 109 pairs. The host interface can be a serial interface for non-return-to-zero (NRZ) transmission of serial data, for example; although embodiments are not so limited. The data can be received as differential signals, with the electrical signals being provided as respective differential pairs. The signals provided across the channels can experience distortion due to transmission line reflections and/or intersymbol interference (ISI), for example. The interface circuitry (e.g., 113) can include equalization circuitry to compensate for high frequency losses and transmission reflections.

The interface circuitry 113 includes sampling latch control circuitry 118 that can be used to adjust the sampling threshold voltages of respective sampling latches (not shown in FIG. 1) that can be used to convert received differential analog signals to digital values. As described in further detail below in association with FIG. 2 and FIG. 3, the sampling latch control circuitry 118 can include a number of reference digital-to-analog converters (DACs) (e.g., reference DACs 223-1, 223-2, . . . , 223-M) as well as control loop circuitry (e.g., control loop circuitry 219) that can be used to track and control both the differential voltage and common mode voltage of the signals provided to the sampling latches. For example, embodiments of the present disclosure can provide the ability to set the common mode voltage of the sampling thresholds to be equal to the common mode voltage of the signal being sampled (e.g., the differential signals being received at the interface circuitry 113 from the host 102).

The memory devices 120 can include various combinations of different types of non-volatile memory devices and/or volatile memory devices. An example of non-volatile memory devices includes a NAND flash memory. The memory devices 120 can include one or more arrays of memory cells and other circuitry not shown (e.g., an internal controller, decode circuitry, sense amplifiers, etc.). Embodiments are not limited to a particular type of memory. For example, the memory devices 120 can include random access memory (RAM), read-only memory (ROM), dynamic random access memory (DRAM), synchronous dynamic random access memory (SDRAM), phase change memory (PCM), magneto random access memory (MRAM), NOR flash memory, electrically erasable programmable read-only memory (EEPROM), and a cross-point array of non-volatile memory cells (e.g., 3D cross-point memory).

The controller 110 can communicate with the memory devices 120 to perform operations such as reading data, writing data, or erasing data at the memory devices 120 and other such operations. The controller 110 include a microcontroller, special purpose logic circuitry (e.g., a field programmable gate array (FPGA), an application specific integrated circuit (ASIC), etc.), or other suitable processing circuitry. The controller 110 can include a processing device (e.g., processor 115) configured to execute instructions stored in local memory (not shown).

In general, the controller 110 can receive commands or operations from the host 102 and can convert the commands or operations into instructions or appropriate commands to achieve the desired access to the memory devices 120. The controller 110 can be responsible for other operations such as wear leveling operations, garbage collection operations, error detection and error-correcting code (ECC) operations, encryption operations, caching operations, and address translations between a logical block address and a physical block address that are associated with the memory devices 120.

Although the memory system (e.g., controller 110 and memory device 120) is shown as physically separate from the host 102, in a number of embodiments the memory system can be embedded within the host 102. Alternatively, the memory system 110 can be removable from the host 102.

While the example interface circuitry shown in FIG. 1 has been described in association with communication between a host (e.g., a host chip) and a memory system (e.g., an ASIC controller of a memory system), embodiments are not so limited. For example, the interface circuitry 113 may be deployed on a component (e.g., chip) other than a controller.

As used herein, an "apparatus" can refer to various structural components. For example, the computing environment shown in FIG. 1 can be considered an apparatus. Alternatively, the host 102, the controller 110, and the interface circuitry 118 might each separately be considered an apparatus.

Figure 2:
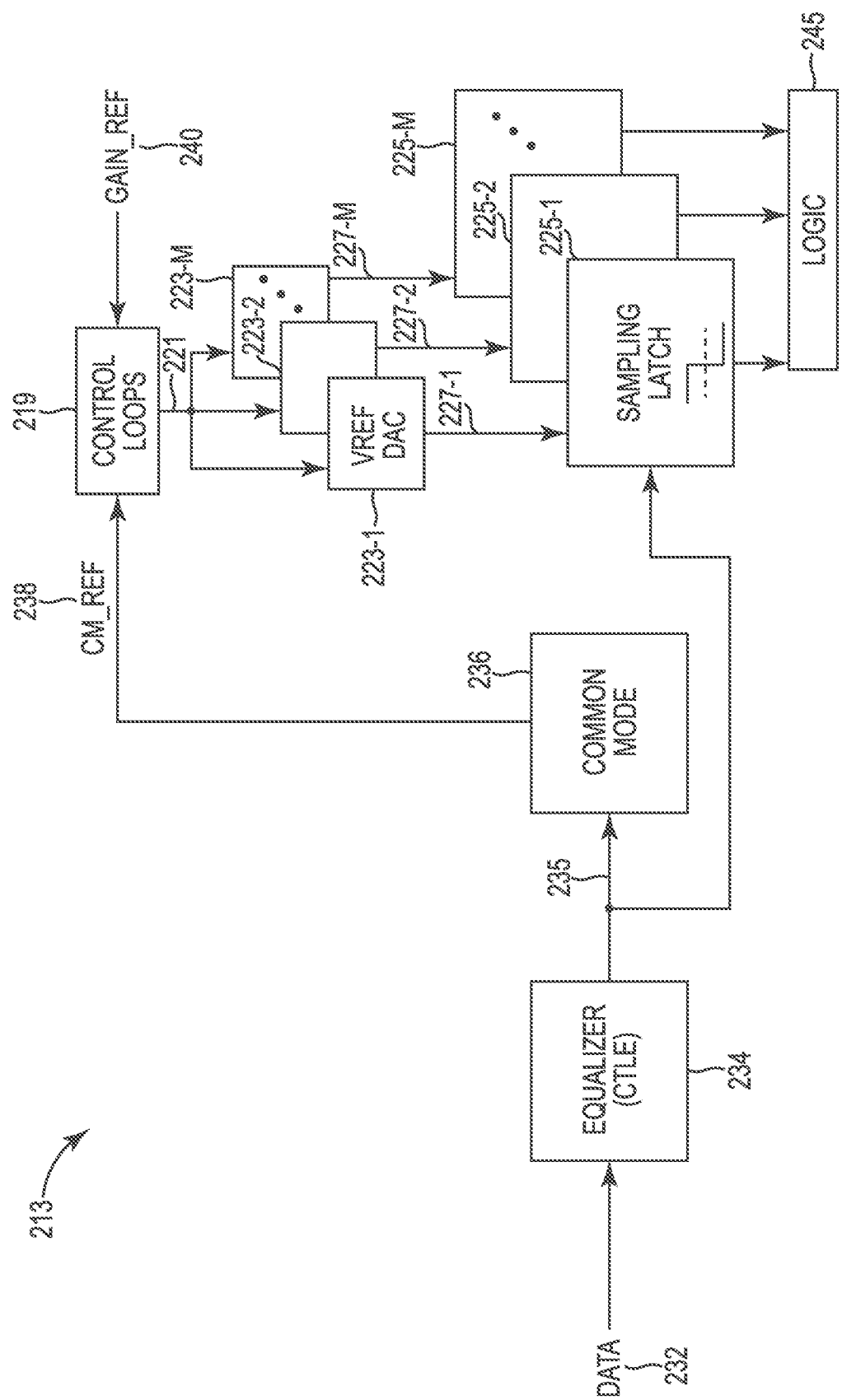
FIG. 2 is a block diagram illustrating a portion of an interface including control loop circuitry in accordance with various embodiments of the present disclosure.

FIG. 2 is a block diagram illustrating a portion of an interface 213 including control loop circuitry in accordance with various embodiments of the present disclosure. As one example, the interface circuitry 213 can correspond to a deserializer portion of a SerDes component of an M-PHY interface. The data signals 232 can be, for example, differential NRZ serial data received on corresponding differential inputs. The differential data signals can be terminated, filtered, amplified, equalized, etc. prior to being received by one or more sampling latches 225-1, 225-2, . . . , 225-M (referred to collectively as sampling latches 225). For example, although not shown in FIG. 2, the differential signals can be amplified by an automatic gain control (AGC) circuit and then can be equalized by an equalizer circuit 234 (e.g., a continuous time linear equalizer (CTLE)). The equalized differential signal 235 output from the equalizer 234 can be provided to a common mode generation component 236 and to the sampling latches 225. The common mode generation component 236 can be, for example, a center tapped resistor divider used to generate the common mode voltage of the differential signal 235. The common mode voltage generated by the common mode generator 236 can be provided to control loop circuitry 219 as a common mode reference voltage 238 (CM_REF). The control loop circuitry 219 is also configured to receive a gain reference voltage 240 (GAIN_REF) and will be discussed in more detail below and in association with FIG. 3. As described further below, the control loop circuitry 219 can provide a bias voltage signals 221 (e.g., DC reference voltages) for biasing circuits (e.g., PMOS and NMOS devices) of a plurality (e.g., an array) of DACs 223-1, 223-2, ..., 223-M (referred to collectively as DACs 223). Although not shown in FIG. 2, the interface circuitry 213 can include noise filtering circuitry (e.g., a pair of noise filters) located between the control loop circuitry 219 and the DACs 223 such that the bias signals 221 provided to the DACs 223 are noise filtered. Since the noise filter circuits are outside of the control loop circuitry 219, but in the band of the DACs 223, the filter circuits can be adjusted (e.g., optimized) independently of the control loops of the control loop circuitry 219, which can provide benefits such as an improved PSRR for the DACs 223 as compared to the PSRR of the control loops in the absence of noise filtering.

As shown in FIG. 2, each of the reference DACs 223-1, 223-2, ..., 223-M can provide respective signals 227-1, 227-2, ..., 227-M (referred to collectively as signals 227) to respective sampling latches 225-1, 225-2, ..., 225-M. The signals 227 can be differential DC voltage signals provided to the sampling latches 225 to perform the functions of compensating for device mismatch (e.g., offset) within the sampling latches 225 and/or adjusting (e.g., skewing) the sampling threshold of the sampling latches 225 for various purposes.

As shown in FIG. 2, the outputs of the sampling latches 225 can be provided to logic 245, which can be within the interface 213 or external to it and can be used for various purposes. For example, as noted above, the outputs of the sampling latches 225 can be used for various purposes that can include providing for CDR edge sampling, vertical eye algorithmic and diagnostic monitoring, and decision feedback equalization (DFE) functionality, for example. In various cases (e.g., for high speed data), the sampling latches 225 can include means to calibrate out differential offsets resulting from device (e.g., transistor) mismatch. As an example, a sampling latch may include two differential pairs in parallel with one pair receiving its differential signal from the equalizer (e.g., differential signal 235 from equalizer 234) and the other pair receiving a differential voltage signal from a DAC (e.g., a signal 227 from DAC 223). In such instances, it can be beneficial for the common mode voltages of the differential signals to be equal; however, tracking the common mode voltage of the differential signal output from the equalizer can be difficult and can have a common mode voltage following complicated temperature, voltage, and process dependencies. Therefore, providing the ability to track and control the common mode voltage of the differential voltage signal 235 provided to a sampling latch 225 via control loop circuitry 219 as described herein can be beneficial for improving the function of the sampling latches 225.

Figure 3:
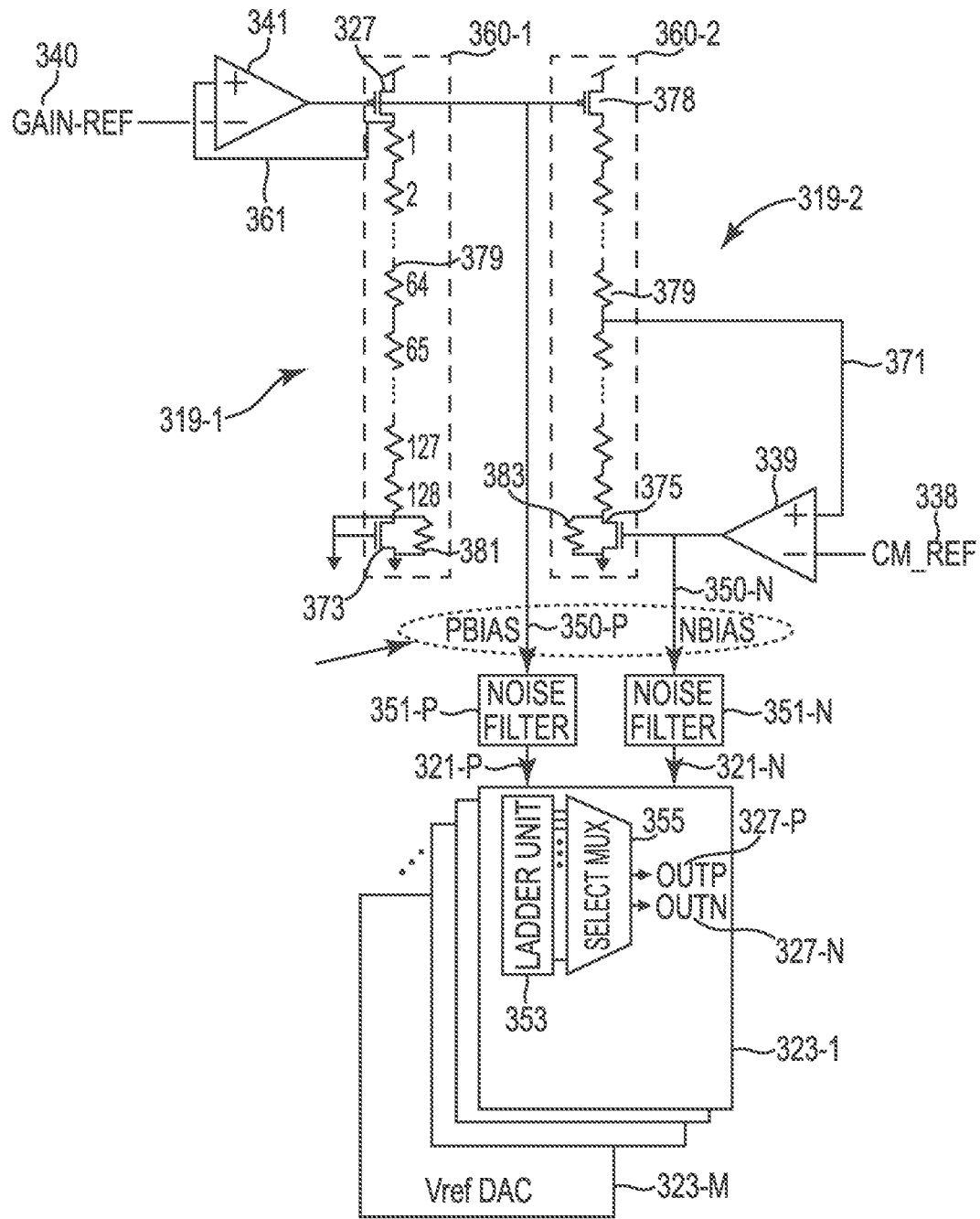
FIG. 3 illustrates example control loop circuitry in accordance with various embodiments of the present disclosure.

FIG. 3 illustrates example control loop circuitry in accordance with various embodiments of the present disclosure. In this example, the control loop circuitry includes a first control loop portion 319-1 and a second control loop portion 319-2. The first portion 319-1 outputs a first bias voltage 350-P (PBIAS) and the second portion 319-2 outputs a second bias voltage 350-N (NBIAS) that are provided to the array of DACs 323-1 to 323-M (referred to collectively as DACs 323). The bias voltages 350-N and 350-P are DC reference voltages for biasing respective NMOS gates and PMOS gates in the DACs 323. The DACs 323 provide a differential output signal 327-P (OUTP) and 327-N (OUTN) to respective sampling latches such as latches 225 described in FIG. 2. The output signals 327-P and 327-N are functions of the bias voltages 350-P and 350-N.

The first control loop portion 319-1 and the second control loop portion 319-2 comprise respective "ladder units" 360-1 and 360-2. The ladder unit 360-1 includes a plurality of series coupled resistors 379 (e.g., a resistor ladder) between a PMOS transistor 377 header device and an NMOS transistor 373 and parallel resistor 381 footer circuit. The ladder unit 360-2 includes a plurality of series coupled resistors 379 between a PMOS transistor 378 header device and an NMOS transistor 375 and parallel resistor 383 footer circuit.

An operational amplifier 341 drives the first control loop portion 319-1 with its output (PBIAS 350-P) being coupled to the gate of the PMOS transistor 377, which acts as a current source. The amplifier 341 receives a gain reference voltage 340 (GAIN_REF) at a first input, and the drain of the PMOS transistor 377 is fed back to the second input of the operational amplifier 341 such that feedback voltage will equal the gain reference voltage 340. The footer circuit of control loop portion 319-1 is bypassed to ground (e.g., the gate of NMOS transistor 373 and both terminals of the parallel resistor 381 are coupled to ground), so the DC operating point results in the least significant bit (LSB) step (e.g., Vlsb) being equal to GAIN_REF divided by the quantity of resistors 379 in the ladder (e.g., 128 in this example). For instance, for a gain reference voltage of 320 mV, each resistor in the ladder would have a 2.5 mV voltage drop (320 mV/128). The gain reference voltage 340 can be a precision temperature compensated voltage provide by a bandgap reference, for example, so can provide a precision DAC gain and step size. The PBIAS voltage 350-P is also provided to the PMOS header device 378 of the ladder unit 360-2 and to PMOS header devices within the DACs 323 (e.g., within ladder units 353 of the DACs 323).

An operational amplifier 339 drives the second control loop portion 319-2 with its output (NBIAS 350-N) being coupled to the gate of the NMOS transistor 375 of its footer circuit. The amplifier 339 receives a common mode reference voltage 338 (CM_REF) at a first input, and its second input 371 is coupled to the center tap of the resistor ladder comprising resistors 379. As such, the control loop of portion 319-2 controls the drain to source on state resistance (Rds) of the NMOS transistor 375. The PMOS header device 378 acts as a good current source such that the current in the resistor ladder of unit 360-2 is independent of the voltage across its footer circuit (e.g., the voltage across resistor 383). Accordingly, the control loop of portion 319-2 controls the NMOS transistor 375 until the center tap voltage of the resistor ladder is equal to the common mode reference voltage 338. As noted above, the common mode reference voltage 338 is the common mode voltage of the received differential signal as determined by a common mode component such as component 236 shown in FIG. 2.

The DACs 323 can each use the bias signals 350-P and 350-N (e.g., DC reference voltages) to set their DC operating points. For example, each DAC 323 can include a resistor ladder unit 353, which can be similar to the resistor ladder units 360-1 and 360-2, with the PBIAS signal 350-P driving a gate of a PMOS transistor of the corresponding header circuit, and the NBIAS signal 350-N driving a gate of an NMOS transistor of the corresponding footer circuit.

Since the bias signals 350-N and 350-P only drive gates, no current flows to the DACs 323 from the control loops 319-1 and 319-2, which can provide benefits such as simplified bias routing. The DACs 323 also include a selection multiplexor (SELECT MUX) 355 to select a particular location within the resistor ladder to provide the desired differential output values (OUTP and OUTN).

As described above, the bias signals 350-P and 350-N can be filtered via respective noise filter circuits 351-P and 351-N prior to reaching the DACs 323 such that the filtered bias signals 321-P and 321-N are provided to the DACs 323, which can provide improved PSRR for the DACs 323. The separate control loops 319-1 and 319-2 provide the ability to set an accurate differential DAC gain (Vlsb step size) due to the precision gain reference voltage 340 and to set the common mode voltage independently of the DAC gain.

Figure 4:
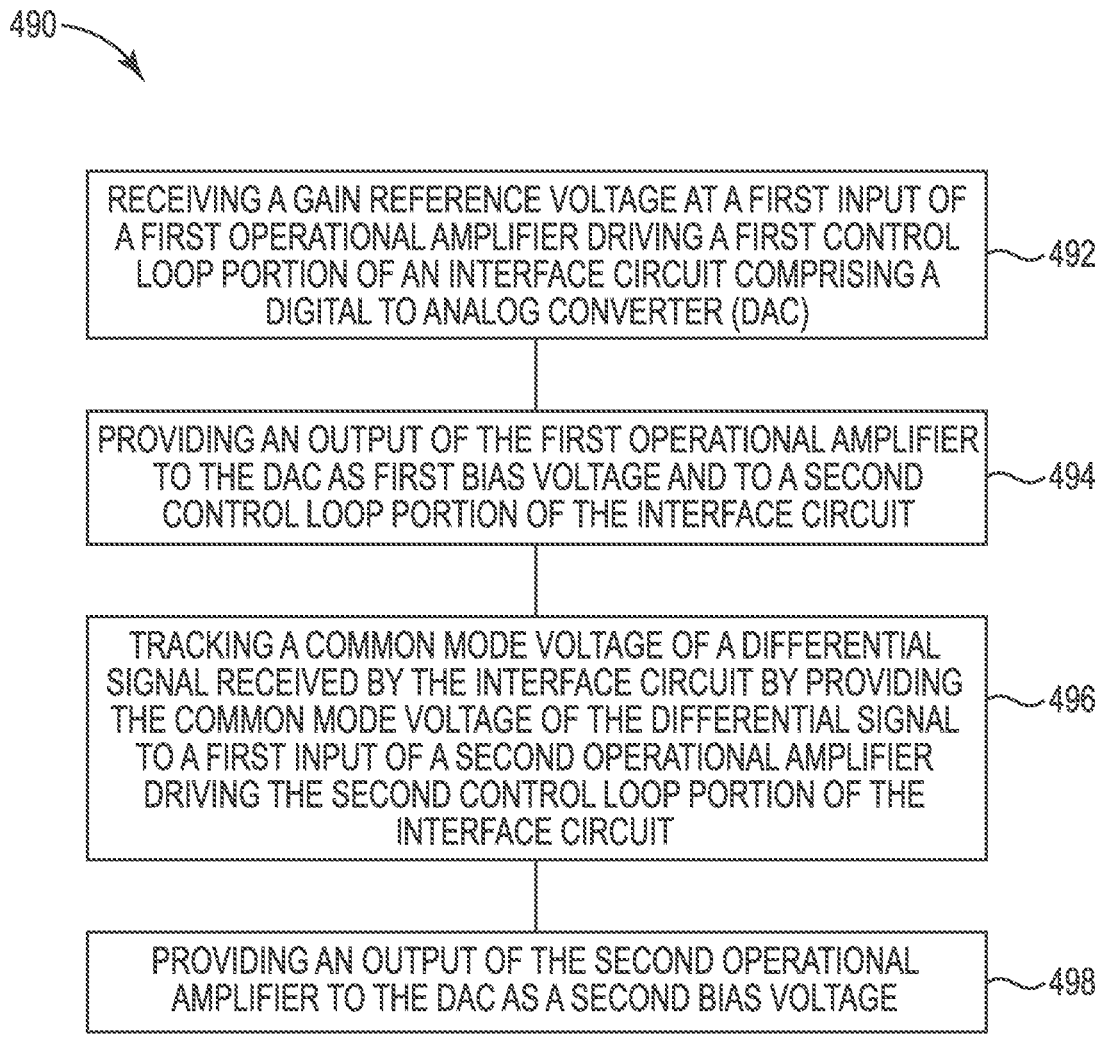
FIG. 4 illustrates an example method for using control loop circuitry in accordance with various embodiments of the present disclosure.

FIG. 4 illustrates an example method for using control loop circuitry in accordance with various embodiments of the present disclosure. The method 490 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 490 is performed by the interface circuitry 113 of FIG. 1 and/or the interface circuitry 213 of FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 492, the method 490 includes receiving a gain reference voltage (e.g., 240, 340) at a first input of a first operational amplifier (e.g., 341) driving a first control loop portion (e.g., 319-1) of an interface circuit (e.g., 113, 213) comprising a DAC (e.g., 223, 323). At block 494, the method includes providing an output of the first operational amplifier to the DAC as first bias voltage (350-P) and to a second control loop portion (e.g., 319-1) of the interface circuit.

At block 496, the method 490 includes tracking a common mode voltage of a differential signal (e.g., 235) received by the interface circuit by providing the common mode voltage (e.g., 238, 338) of the differential signal to a first input of a second operational amplifier (e.g., 339) driving the second control loop portion of the interface circuit. At block 498, the method includes providing an output of the second operational amplifier to the DAC as a second bias voltage (e.g., 350-N).

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, which can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

The figures herein follow a numbering convention in which the first digit or digits correspond to the drawing figure number and the remaining digits identify an element or component in the drawing. Similar elements or components between different figures may be identified by the use of similar digits. For example, 113 may reference element "13" in FIG. 1, and a similar element may be referenced as 213 in FIG. 2. As will be appreciated, elements shown in the various embodiments herein can be added, exchanged, and/or eliminated so as to provide a number of additional embodiments of the present disclosure.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An interface circuit, comprising:
   a digital to analog converter (DAC) configured to provide a differential output signal;
   a first control loop portion configured to receive a gain reference voltage and to output a first bias voltage to the DAC;
   a second control loop portion configured to receive a common mode voltage of a differential input signal and to output a second bias voltage to the DAC; and
   a sampling latch, wherein the DAC is configured to provide the differential output signal to the sampling latch to adjust a sampling threshold of the sampling latch.

2. The interface circuit of claim 1, wherein a common mode of the differential output signal provided to the sampling latch by the DAC matches a common mode of a differential input signal provided to the sampling latch by an equalization circuit.

3. The interface circuit of claim 1, wherein the first control loop portion comprises a first ladder unit comprising a first plurality of resistors coupled in series between a first transistor and a second transistor.

4. The interface circuit of claim 3, wherein the first control loop portion comprises a first operational amplifier, and wherein:
   an output of the first operational amplifier is coupled to a gate of the first transistor;
   a first input of the first operational amplifier is configured to receive the gain reference voltage; and
   a second input of the first operational amplifier is coupled to a first source/drain node of the first transistor.

5. The interface circuit of claim 4, wherein the second control loop portion comprises a second ladder unit comprising a second plurality of resistors coupled in series between a third transistor and a fourth transistor.

6. The interface circuit of claim 5, wherein the second control loop portion comprises a second operational amplifier, and wherein:
   an output of the second operational amplifier is coupled to a gate of the fourth transistor;
   a first input of the second operational amplifier is configured to receive the common mode voltage of the differential input signal; and
   a second input of the second operational amplifier is coupled to a common node of a pair of resistors from among the second plurality of resistors.

7. The interface circuit of claim 5, wherein the output of the first operational amplifier is coupled to a gate of the third transistor.

8. The interface circuit of claim 5, wherein the DAC comprises a third ladder unit comprising a plurality of resistors coupled in series between a fifth transistor and a sixth transistor, and wherein the output of the first operational amplifier is coupled to the gate of the fifth transistor.

9. The interface circuit of claim 1, wherein the first bias voltage is a first direct current (DC) reference voltage for biasing a first transistor gate of a resistor ladder unit of the DAC, and wherein the second bias voltage is a second DC reference voltage for biasing a second transistor gat of the resistor ladder unit of the DAC.

10. A method, comprising:
    receiving a gain reference voltage at a first input of a first operational amplifier driving a first control loop portion of an interface circuit comprising a digital to analog converter (DAC);
    providing an output of the first operational amplifier to the DAC as a first bias voltage and to a second control loop portion of the interface circuit;
    tracking a common mode voltage of a differential signal received by the interface circuit by providing the common mode voltage of the differential signal to a first input of a second operational amplifier driving the second control loop portion of the interface circuit;
    providing an output of the second operational amplifier to the DAC as a second bias voltage; and
    providing a differential output signal from the DAC to a sampling latch in association with adjusting a sampling threshold of the sampling latch.

11. The method of claim 10, wherein the DAC comprises a resistor ladder comprising a plurality of resistors coupled in series between a PMOS transistor and an NMOS transistor, and wherein the method comprises providing the first bias voltage to a gate of the PMOS transistor and providing the second bias voltage to a gate of the NMOS transistor.

12. The method of claim 10, wherein the first control loop comprises a first resistor ladder comprising a plurality of resistors coupled in series between a first PMOS transistor and a first NMOS transistor, wherein the second control loop comprises a second resistor ladder comprising a plurality of resistors coupled in series between a second PMOS transistor and a second NMOS transistor, and wherein the method includes controlling, with the second control loop, a drain to source resistance (Rds) of the second NMOS transistor until a center tap of the second resistor ladder is equal to the common mode voltage provided to the second operational amplifier.

13. An apparatus, comprising:
    a sampling latch receiving a first differential voltage signal from an equalizer circuit;
    digital to analog converter (DAC) circuitry configured to provide a second differential voltage signal to the sampling latch to adjust a sampling threshold of the sampling latch; and
    control loop circuitry coupled to the DAC circuitry and comprising:
        a first control loop driven by a first operational amplifier receiving a gain reference voltage, wherein the first control loop is configured to provide a first bias voltage to the DAC circuitry; and
        a second control loop driven by a second operational amplifier receiving a common mode voltage of the first differential voltage signal from the equalizer circuit, wherein the second control loop is configured to provide a second bias voltage to the DAC circuitry.

14. The apparatus of claim 13, wherein the second control loop is configured to set a common mode voltage of the second differential voltage signal independently of a DAC gain corresponding to the DAC circuitry.

15. The apparatus of claim 14, wherein the first control loop, the second control loop, and the DAC circuitry include respective resistor ladder units.

16. The apparatus of claim 15, wherein the respective ladder units each include a header transistor that is driven by the first bias voltage.

17. The apparatus of claim 13, further comprising:

a first filter circuit configured to filter the first bias voltage prior to the first bias voltage being provided to the DAC circuitry; and a second filter circuit configured to filter the second bias voltage prior to the second bias voltage being provided to the DAC circuitry.

18. The apparatus of claim 13, wherein the second control loop includes a footer circuit comprising an NMOS transistor and a parallel resistor, and wherein the second control loop controls a drain to source resistance of the NMOS transistor until a center tap voltage of a resistor ladder corresponding to the second control loop is equal to the common mode voltage received by the second operational amplifier.

19. An interface circuit, comprising:

a digital to analog converter (DAC) configured to provide a differential output signal;

a first control loop portion configured to receive a gain reference voltage and to output a first bias voltage to the DAC; and a second control loop portion configured to receive a common mode voltage of a differential input signal and to output a second bias voltage to the DAC;

wherein the first control loop portion comprises a first ladder unit comprising a first plurality of resistors coupled in series between a first transistor and a second transistor;

wherein the first control loop portion comprises a first operational amplifier, and wherein:

an output of the first operational amplifier is coupled to a gate of the first transistor;

a first input of the first operational amplifier is configured to receive the gain reference voltage; and a second input of the first operational amplifier is coupled to a first source/drain node of the first transistor.

* * * * *